United States Patent [19]

Lee et al.

[11] Patent Number: 5,122,848
[45] Date of Patent: Jun. 16, 1992

[54] INSULATED-GATE VERTICAL FIELD-EFFECT TRANSISTOR WITH HIGH CURRENT DRIVE AND MINIMUM OVERLAP CAPACITANCE

[75] Inventors: Ruojia Lee; Fernando Gonzalez, both of Boise, Id.

[73] Assignee: Micron Technology, Inc., Boise, Id.

[21] Appl. No.: 682,623

[22] Filed: Apr. 8, 1991

[51] Int. Cl.[5] ............... H01L 29/78; H01L 29/44
[52] U.S. Cl. .................... 357/23.6; 357/55; 357/71; 357/23.4
[58] Field of Search ............ 357/23.4, 55, 71, 23.6

[56] References Cited

U.S. PATENT DOCUMENTS

| | | | |
|---|---|---|---|
| 4,116,720 | 9/1978 | Vinson | 148/1.5 |
| 4,199,774 | 4/1980 | Plummer | 357/41 |
| 4,272,302 | 6/1981 | Jhabvala | 148/1.5 |
| 4,359,816 | 11/1982 | Abbas et al. | 29/571 |
| 4,364,073 | 12/1982 | Becke et al. | 357/23 |
| 4,364,074 | 12/1982 | Garnache et al. | 357/23 |
| 4,374,455 | 2/1983 | Goodman | 29/571 |
| 4,464,212 | 8/1984 | Bhatia et al. | 148/187 |
| 4,476,622 | 10/1984 | Cogan | 29/571 |
| 4,503,598 | 3/1985 | Vora et al. | 29/571 |
| 4,543,706 | 10/1985 | Bencuya et al. | 29/571 |
| 4,566,172 | 1/1986 | Bencuya et al. | 29/571 |
| 4,567,641 | 2/1986 | Baliga et al. | 29/571 |
| 4,650,544 | 3/1987 | Erb et al. | 156/653 |
| 4,758,528 | 7/1988 | Goth et al. | 457/15 |
| 4,859,622 | 8/1989 | Eguchi | 437/47 |
| 4,890,144 | 12/1989 | Teng et al. | 357/23.4 |
| 4,920,065 | 4/1990 | Chin et al. | 437/52 |
| 4,941,026 | 7/1990 | Temple | 357/23.4 |

OTHER PUBLICATIONS

Krishna Shenai, A 55-V, 0.2-mΩ. cm[2] Vertical Trench Power MOSFET, *IEEE Electron Device Letters*, vol. 12 No. 3, Mar. 1991, pp. 108–110.

Tadahiro Ohmi, Power Static Induction Transistor Technology, *IEEE Paper*, Catalog No. CH1504-0/79/0000-0084 pp. 84–87.

Nicky C. C. Lu, Advanced Cell Structures for Dynamic RAMs, *IEEE Circuits and Devices Magazine*, 1/89, pp. 27–36.

*Primary Examiner*—Jerome Jackson, Jr.
*Attorney, Agent, or Firm*—Marger, Johnson, McCollom & Stolowitz

[57] ABSTRACT

An insulated-gate vertical FET has a channel region and gate structure that is formed along the sidewall of trench in a P-type semiconductor substrate. The drain and source regions of the FET are formed in the mesa and the base portions of the trench. All contacts to the gate, drain, and source regions can be made from the top surface of the semiconductor substrate. One or more sidewalls of the trench are oxidized with a thin gate oxide dielectric layer followed by a thin polysilicon deposited film to form an insulated gate layer. A reactive ion etch step removes the insulated gate layer from the mesa and the base portion of the trench. An enhanced N-type implant creates the drain and source regions in the mesa and the base portions of the trench. The trench is partially filled with a spacer oxide layer to reduce gate-to-source overlap capacitance. A conformal conductive polysilicon layer is deposited over the insulated gate layer. A portion of the conductive polysilicon layer is extended above the surface of the trench onto the mesa to form a gate contact. A field oxide covers the entire surface of the FET, which is opened in the mesa to form gate and drain contacts, and in the base to form the source contact.

17 Claims, 6 Drawing Sheets

INSULATED-GATE VERTICAL FIELD-EFFECT TRANSISTOR WITH HIGH CURRENT DRIVE AND MINIMUM OVERLAP CAPACITANCE

BACKGROUND OF THE INVENTION

This invention relates generally to field-effect transistors ("FETs"), and more particularly to those FETs having a channel region that is generally vertical with respect to the horizontal plane of the silicon wafer.

As the performance and complexity of integrated circuits, and in particular memory circuits, increases, the area of an individual transistor on the integrated circuit must decrease in order to maintain die size and to control manufacturing costs. In the past, vertical FETs were introduced either in a trench or a V-groove to align the channel region of the FET vertically. Therefore, the area of the FET could be reduced because the channel did not use valuable horizontal area leading to a larger die area. A problem with many of the vertical designs is that performance is sacrificed as the area is decreased. Parasitic capacitance from the gate of the FET to the source ("overlap capacitance"), drain, or substrate can increase in the vertical FET, which results in a lower maximum operating frequency. In addition, in many vertical designs, the drain contact is made at the bottom of the FET through the substrate or by directly metallizing the bottom surface of the die, and thus the drain and source contacts cannot both be made at the surface of the transistor.

Accordingly, a need remains for a vertical FET having an area smaller than a horizontal FET having a comparable channel region, while having minimum gate parasitic capacitance and the option of surface gate, source, and drain contacts.

SUMMARY OF THE INVENTION

It is, therefore, an object of the invention to provide a vertical FET having a small horizontal area suitable for high density integration on a silicon die.

Another object of the invention is to provide a vertical FET having low parasitic gate capacitance in order to maintain a high maximum operating frequency.

A further object of the invention is to provide a vertical FET having a high current drive capability.

An advantage of the invention is that the vertical FET requires no additional masking steps beyond those normally required for the fabrication of an integrated random access memory.

Another advantage of the invention is that the source, drain, and gate contacts of the vertical FET may all be contacted from the top surface of the die, if desired.

Another advantage of the invention is that the gate region within each trench sidewall contains no discontinuous features that decrease breakdown voltage.

According to the present invention, an insulatedgate vertical FET has a channel region and gate structure that is formed along the sidewall of trench in a P-type semiconductor substrate. The drain and source regions of the FET are formed in the mesa and the base portions of the trench. All contacts to the gate, drain, and source regions can be made from the top surface of the semiconductor substrate. One or more sidewalls of the trench are oxidized with a thin gate oxide dielectric layer followed by a thin polysilicon deposited film to form an insulated gate layer. A reactive ion etch step removes the insulated gate layer from the mesa and the base portions of the trench. An enhanced N-type implant creates the drain and source regions in the mesa and the base portions of the trench. The trench is partially filled with a spacer oxide layer to reduce gate-to-source overlap capacitance. A conformal conductive polysilicon layer is deposited over the insulated gate layer. A portion of the conductive polysilicon layer is extended above the surface of the trench onto the mesa to form a gate contact. A field oxide covers the entire surface of the FET, which is opened in the mesa to form gate and drain contacts, and in the base to form the source contact.

The foregoing and other objects, features and advantages of the invention are more readily apparent from the following detailed description of a preferred embodiment of the invention, which proceeds with reference to the accompanying drawings.

BRIEF DESCRIPTION OF THE DRAWING FIGURES

FIGS. 1-1A, 2-3, 4-4A, 5, 6-6A, 7, 8 and 8A are plan and sectional views of a semiconductor substrate at various stages of processing in accordance with the invention that ultimately form an insulated-gate vertical FET.

DETAILED DESCRIPTION

Figure 8:
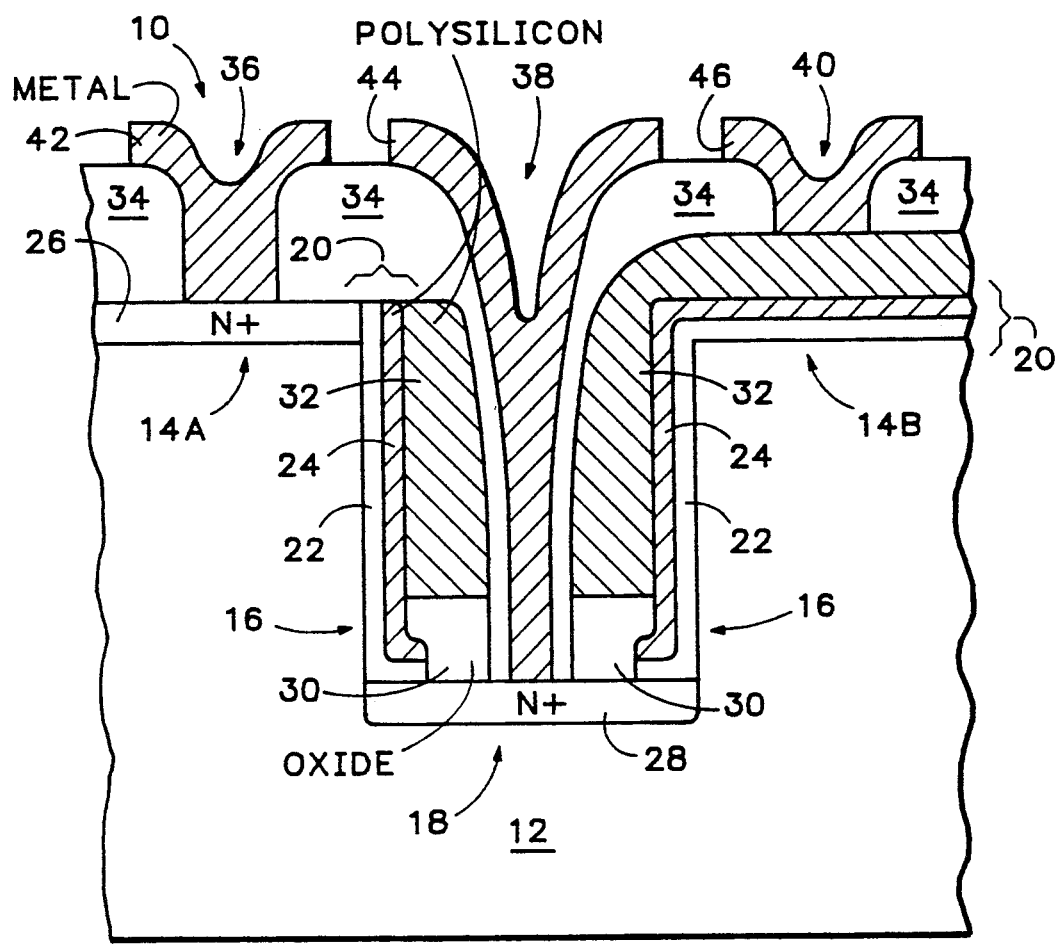

The sectional view of a completed insulated-gate vertical FET 10 is shown in the sectional view of FIG. 8. A semiconductor substrate 12 forms the starting material for the FET. The substrate material can be P-type or N-type silicon formed in a wafer, epitaxial layer, or well. The top surface of the substrate defines a reference surface for defining subsequent vertical structures. A trench in the substrate 12 forms the channel region and the gate structure of the vertical FET 10. The trench defines a surface including first and second mesa portions 14A and 14B at the level of the reference surface of the substrate 12, one or more sidewalls 16, and a base 18 recessed from the reference surface. An insulated gate layer 20 is formed on the sidewalls 16 of the trench, which includes a gate dielectric layer 22 and a gate conductive layer 24.

A first enhanced N-type layer 26 implanted in the first portion of the mesa 14A forms the first current node of the transistor, typically the drain. However, since the drain and source are interchangeable in an FET, the N-type layer 26 can also serve as the source. A second enhanced N-type layer 28 is implanted in the base 18 of the trench to form the second current node of the transistor, typically the source. Again, given the interchangeability of the current nodes, the second enhanced N-type layer 28 can also serve as the drain.

A spacer dielectric layer 30 partially fills the base 18 of the trench and a conductive layer 32 is deposited along the sidewalls 16 of the trench over the insulated gate layer 20 extending from the spacer dielectric layer 30 to the reference surface of the substrate 12. The conductive layer 32 forms part of a gate contact and is spaced apart from the enhanced N-type layer 28 by the spacer dielectric layer 30 to decrease the parasitic overlap capacitance between the gate and source of the FET.

The conductive layer 32 and the spacer dielectric layer 30 are opened to expose the second enhanced N-type layer 28. A field dielectric layer 34 covers the entire surface of the FET 10, and is opened in three places to form drain, source, and gate contacts. The field dielectric layer 34 is opened above the first enhanced N-type layer 26 to form a drain contact 36, which is covered with an interconnect line 42; above the second enhanced N-type layer 28 to form a source contact 38, which is covered with an interconnect line 44; and above the conductive layer 32 in the second portion 14B of the mesa to form a gate contact 40, which is covered with an interconnect line 46.

The structure and method for making the FET 10, and the nature of the individual layers including dimensions and suitable materials is described in greater detail below.

Figure 1:
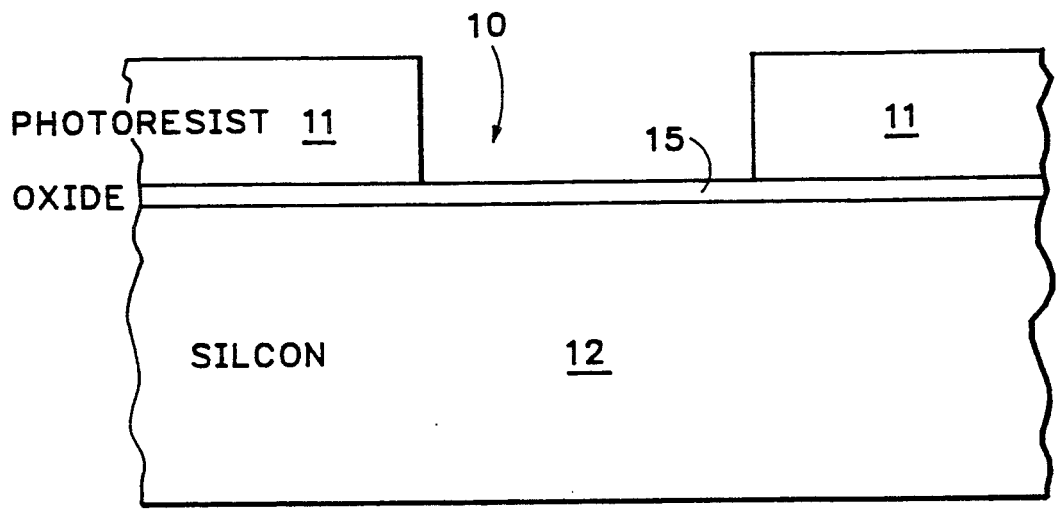
Figure 1A:
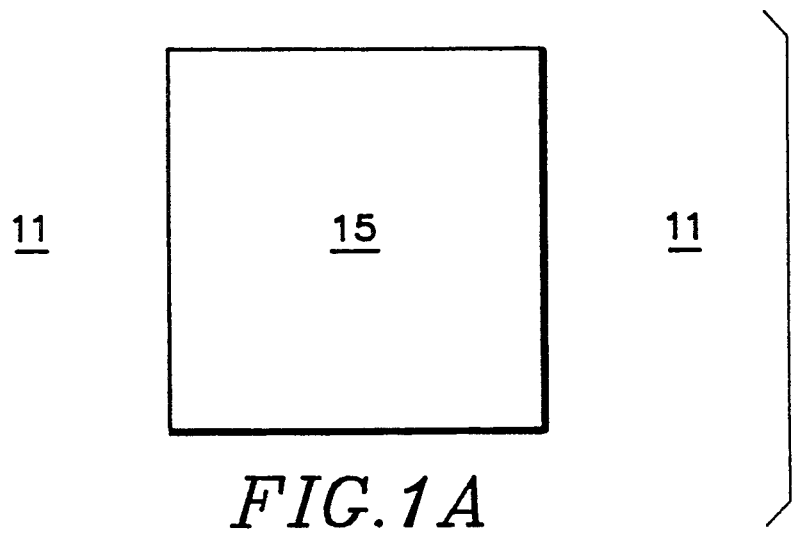

Referring now to FIG. 1, there is shown a sectional view of a partially processed silicon substrate 12 having a patterned photoresist layer 11 over an optional thin grown oxide layer 15. The substrate can be either P-type or N-type material depending upon whether an N-channel or a P-channel FET is desired. FIG. 1A is a corresponding plan view showing the contours of the photoresist opening, which will determine the nature of the trench. In the case of a rectangular pattern, a trench having four sidewalls and a rectangular base is formed. Other patterns, including a circular pattern resulting in one continuous sidewall and polygonal patterns resulting in multiple sidewalls are possible within the constraints of the photolithographic equipment that is used.

Figure 2:
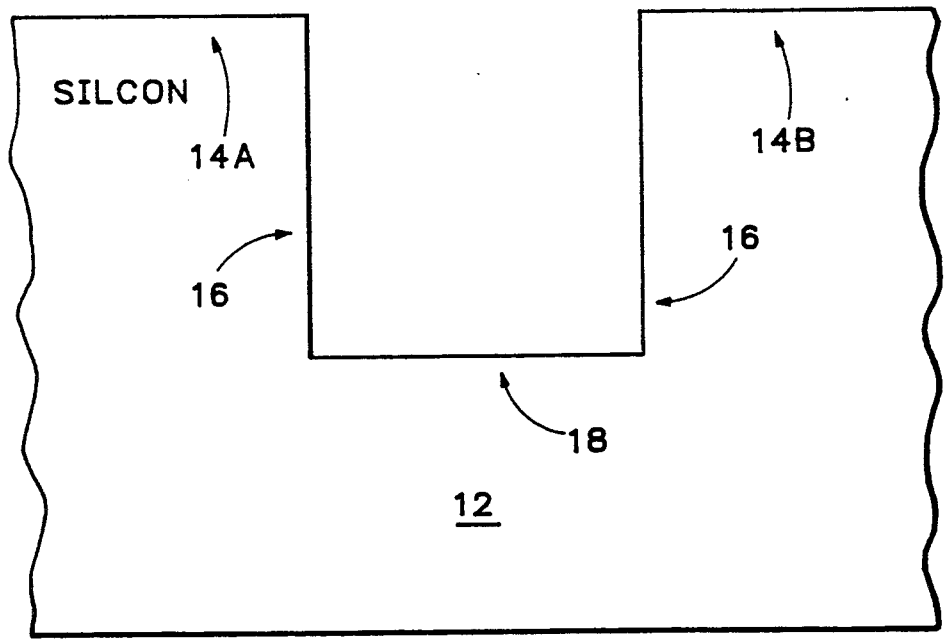

In FIG. 2, the trench is formed with a reactive ion etch, revealing first and second mesa portions 14A and 14B, sidewalls 16, and a base portion 18. The sidewalls 16 of the trench form the body of the FET 10 that includes the channel region. The FET 10 can thus be formed in one or more of the sidewalls 16. The etchant species for removing the silicon substrate and creating the trench can be $CF_4$, or any other conventional etchant species. The depth of the trench defines the length of the channel of the FET 10. Therefore, the channel is ideally etched to a depth equal to the desired length of the channel region, up to a maximum length of about 8000 to 10000 Angstroms. The width, and consequently the width to length ("W/L") ratio of the FET 10, is determined by the dimensions of the photoresist pattern.

Figure 3:
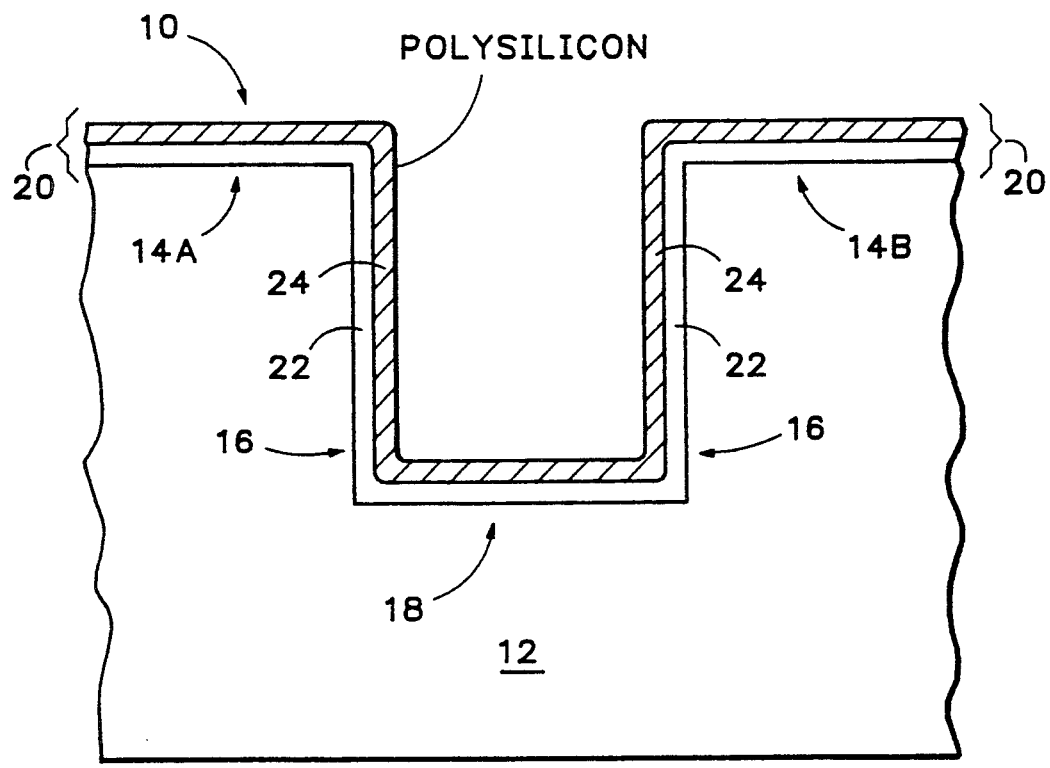

In FIG. 3, the insulated gate layer 20 is revealed in greater detail. The insulated gate layer 20 is comprised of a gate dielectric layer 22 such as oxide, and a gate conductive layer 24 such as polysilicon. The gate oxide layer is grown along the entire surface of the trench to a depth of about 200 to 250 Angstroms, but this depth can be made thinner or thicker as required by the application. The thin gate polysilicon layer 24 is deposited onto the surface of the oxide layer 22 to a thickness of about 500 to 1000 Angstroms. Again, the thickness can be easily adjusted as required by the application. The gate polysilicon layer 24 is highly conformal with oxide layer 22. The gate polysilicon layer 24 forms the active gate contact of the FET 10, which inverts the substrate silicon 12 in the sidewalls 16 of the trench. Therefore, it is desirable that the gate polysilicon layer 24 be doped with an appropriate dopant such as phosphorous to form a conductive layer capable of inverting the entire channel region. A suitable sheet resistance for the gate polysilicon layer 24 after the doping step is completed is about 50 ohms per square.

Figure 4A:
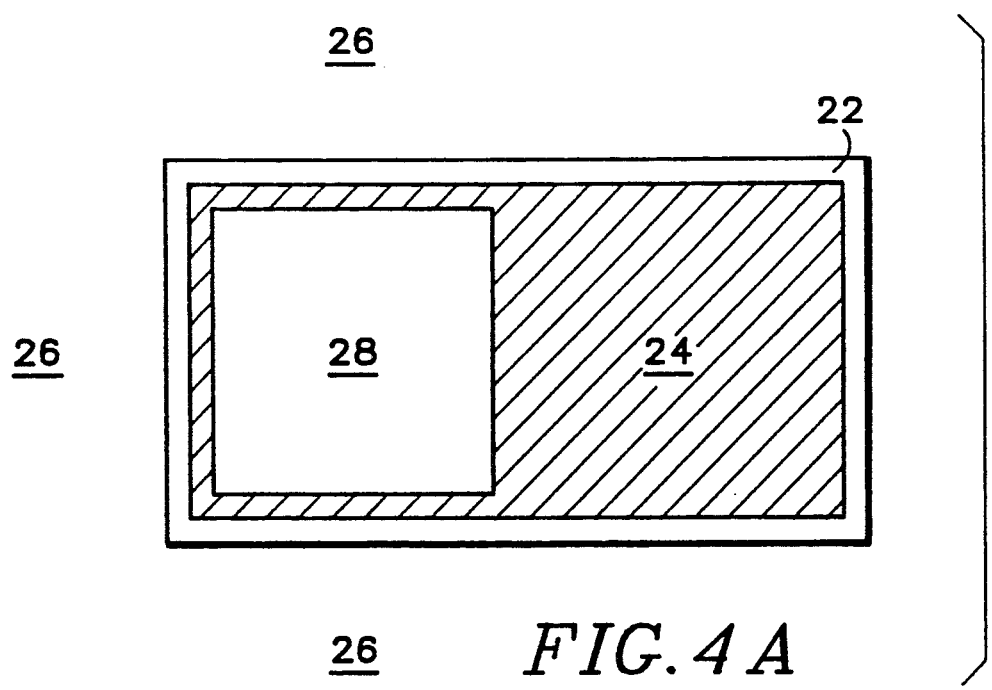
Figure 4:
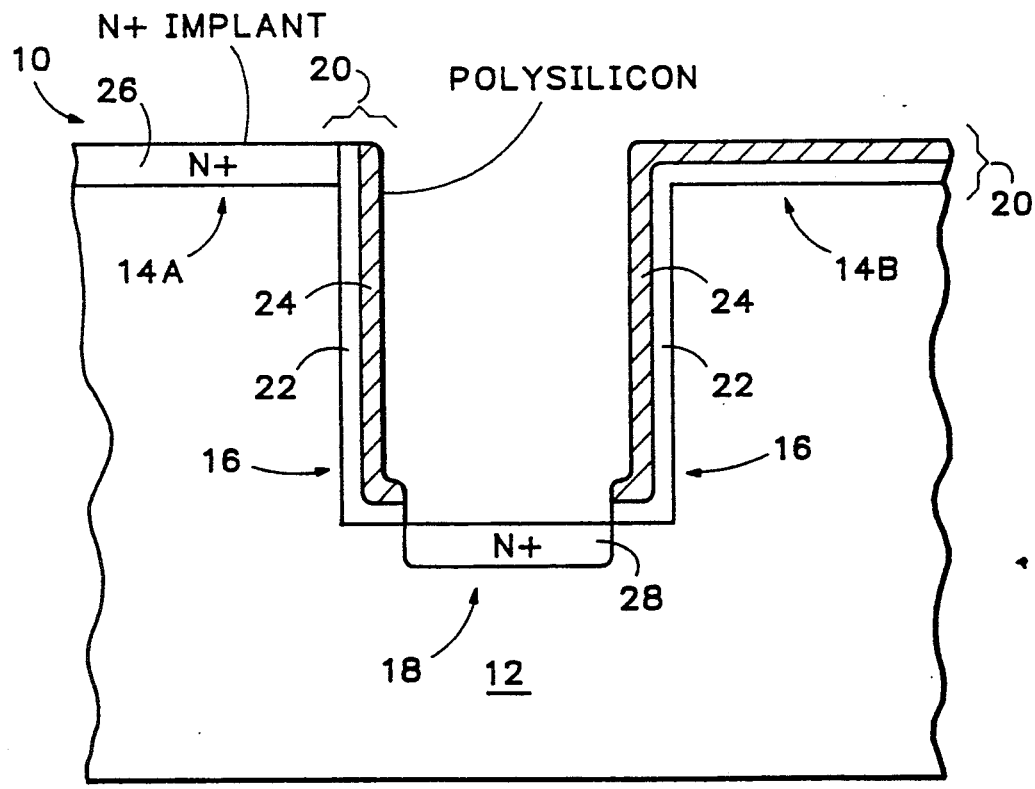

In FIG. 4, the insulated gate layer 24 is removed in a first portion 14A of the mesa, and first and second enhanced N-type ("N+") layers 26 and 28 are implanted into the first portion 14A of the mesa and into the base of the trench 18 to form the active drain and source of the FET 10. The gate polysilicon layer 24 is removed with a reactive ion etch. The gate polysilicon layer remains on the sidewalls 16 since the reactive ion etch acts primarily in the vertical directional and the gate polysilicon layer 24 is conformal to the sidewalls 16. After the gate polysilicon layer 24 is removed with the reactive ion etch, the gate oxide layer 22 is removed from the first portion 14A of the mesa and the base 18 by an oxide etch. After the insulated gate layer 20 is removed, first and second enhanced N-type layers 26 and 28 are implanted into the first portion of the mesa 14A and the base 18. A suitable implant dosage is $9 \times 10^{15}$ ions per $cm^2$ at 30 KeV. The P-N junction between the enhanced N-type layers and the P-type body of the FET 10 using this implant dosage occurs at a depth of approximately 2000 to 4000 Angstroms.

The corresponding plan view is shown in FIG. 4A, revealing the first enhanced N-type layer 26 in the first portion of the mesa 14A, the gate dielectric layer 22 and the gate conductive layer 24 along the sidewalls of the trench and in the second portion of the mesa 14B, and the second enhanced N-type layer 28 in the base of the trench.

Figure 5:
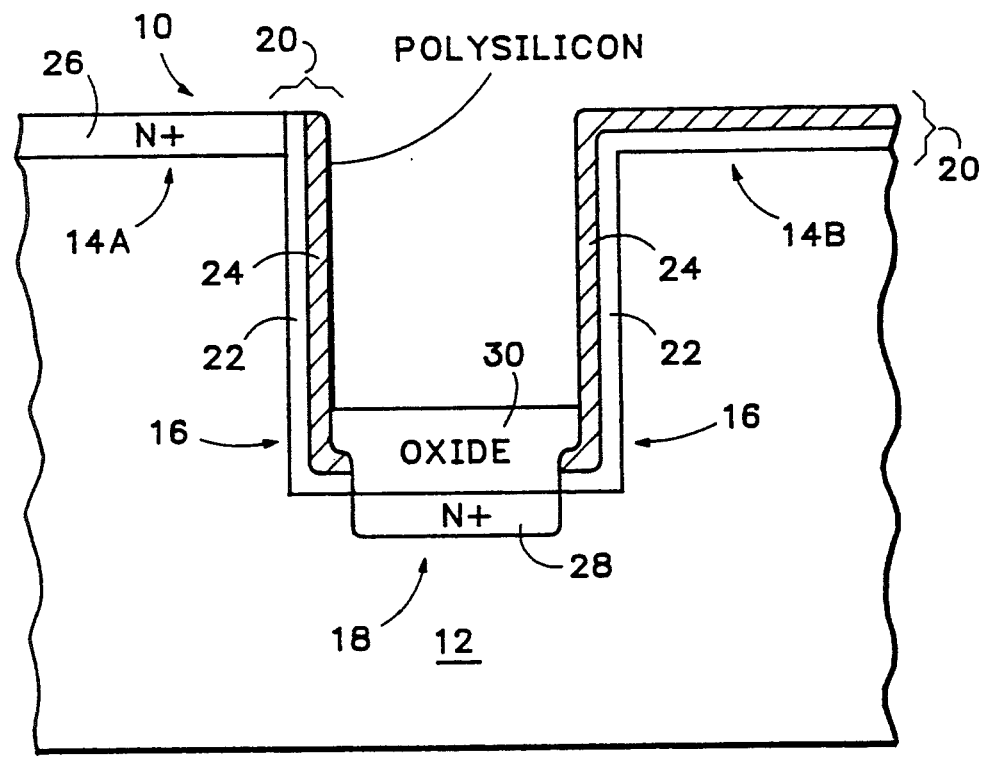

The base 18 of the trench is partially filled with a spacer oxide layer 30 in FIG. 5. The spacer oxide layer 30 minimizes the parasitic overlap capacitance between the gate and the source of the FET 10. The spacer oxide layer 30 is a thick conformal layer that is deposited over the surface of the FET 10, which completely fills in the trench. A mechanical planerization removes most of the spacer oxide layer 30 from the mesa portions of the trench, while leaving the spacer oxide layer 30 in the trench. A subsequent oxide etch removes any remaining oxide from the mesa portions of the trench, and etches back the spacer oxide layer 30 in the trench to partially fill the trench to a thickness of about 2000 to 3000 Angstroms. However, the thickness of the spacer oxide layer 30 can be adjusted depending upon the reduction in the parasitic overlap capacitance that is desired.

Figure 6:
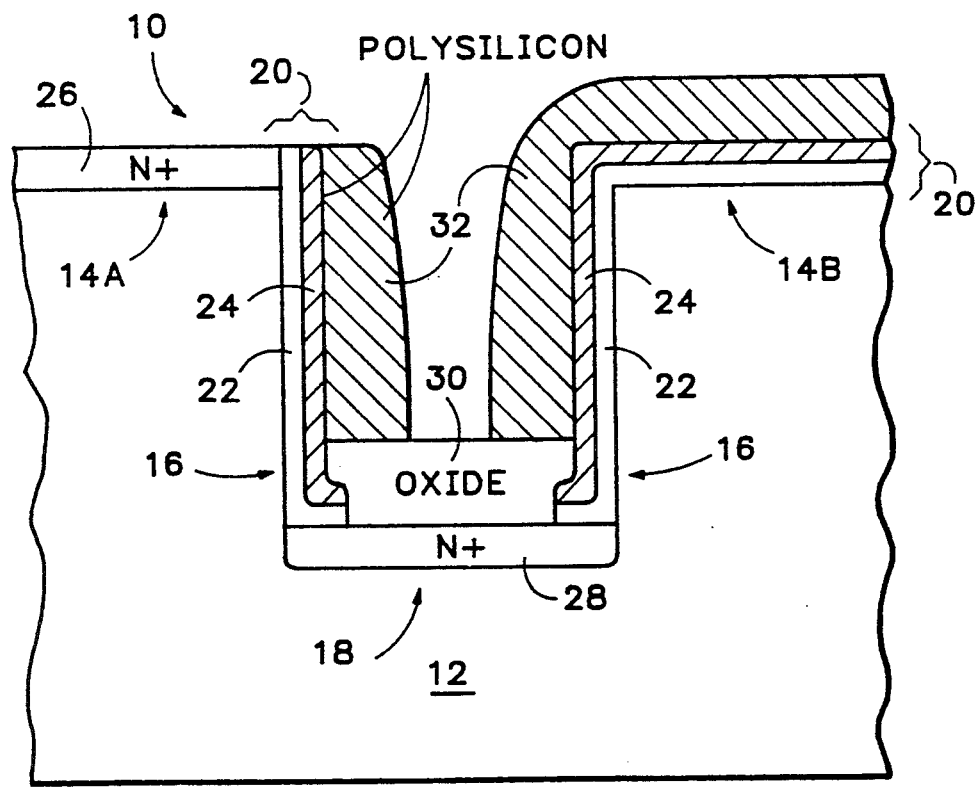

In FIG. 6 a conductive layer 32 is added that contacts the insulated gate layer 20 in order to provide a surface contact for the gate of the FET 10. The conductive layer 32 is a conformal polysilicon layer that is deposited over the entire surface. Once the conductive layer 32 has been deposited, it is masked and etched away in the first portion 14A of the mesa and at the base 18 of the trench. The conductive layer remains on the sidewalls 16 of the trench and in the second portion 14B of the mesa. A suitable thickness for the conductive layer is about 2000 Angstroms. The polysilicon is doped with an appropriate dopant such as phosphorous to render it conductive. A suitable sheet resistance upon completion of the doping step is about 25 to 35 ohms per square.

Figure 6A:
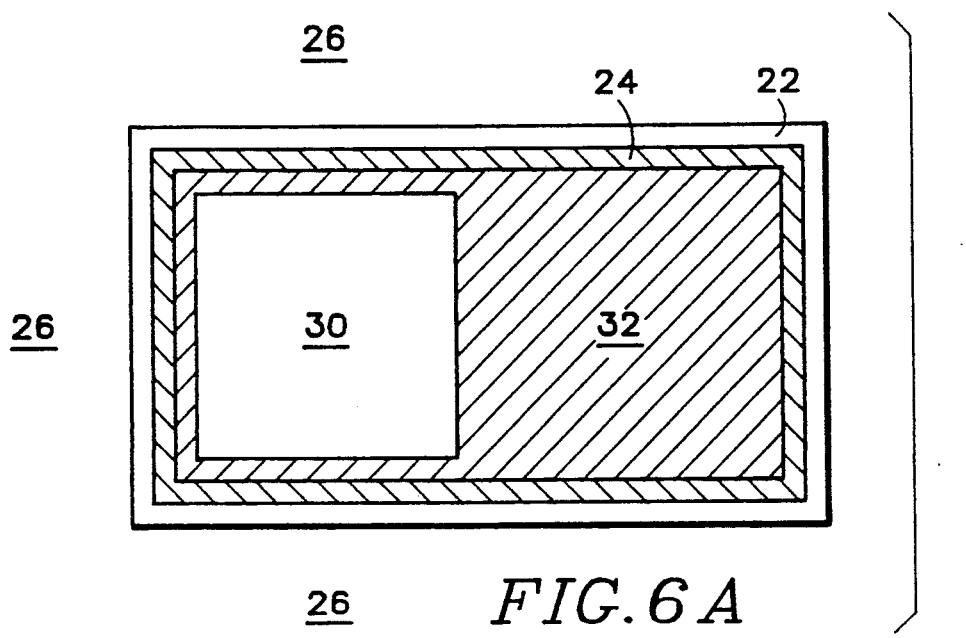

The corresponding plan view is shown in FIG. 6A, revealing the first enhanced N-type layer 26 in the first portion of the mesa 14A, the gate dielectric layer 22, the gate conductive layer 24, and the conductive layer 32 along the sidewalls of the trench and in the second portion of the mesa 14B, and the spacer dielectric layer 30 in the base of the trench.

Figure 7:
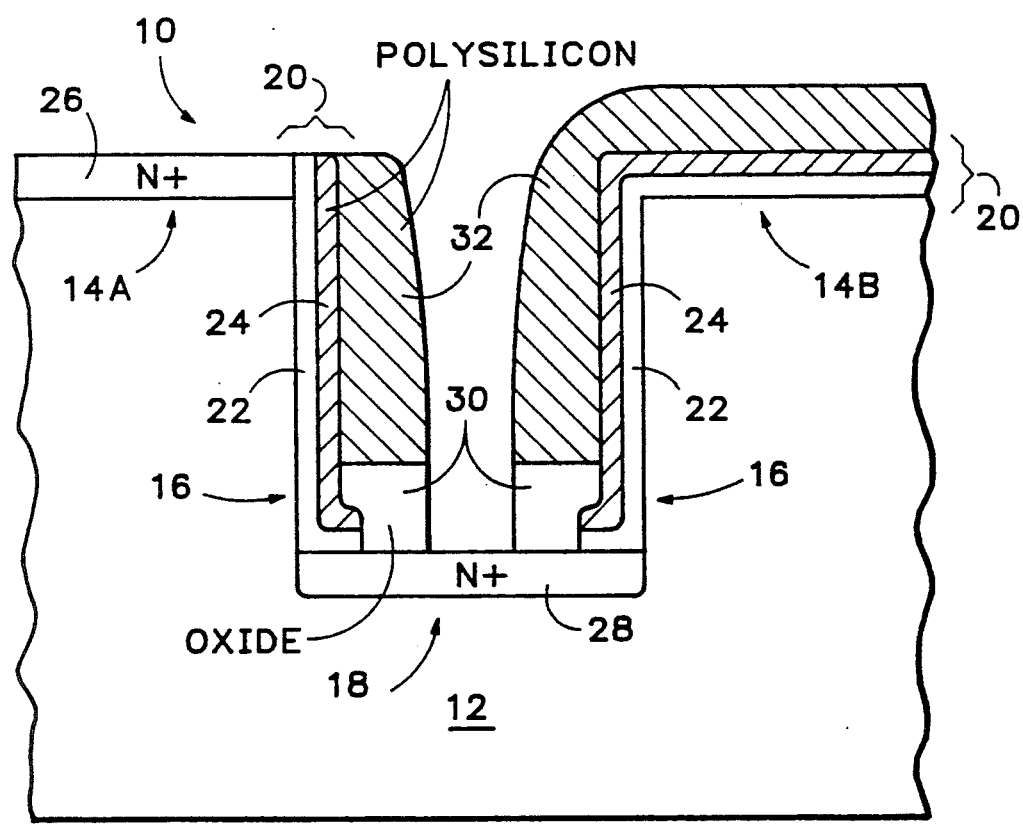

In FIG. 7, a center portion of the spacer dielectric layer 30 is etched away using a conventional oxide etch to reveal the second enhanced N-type layer 28. The opening in the spacer dielectric layer 30 subsequently serves as a top surface source contact. A thick, conformal field dielectric layer 34 such as oxide is subsequently deposited over the entire surface of the FET 10. As discussed above, the field dielectric is etched in three places to form a drain contact 36, a source contact 38, and a gate contact 40. Each contact is respectively covered with a separate interconnect line 42, 44, and 46 for interconnecting the FET 10 with other circuit components. The interconnect lines can be polysilicon, doped polysilicon, or metal such as gold or aluminum.

Figure 8A:
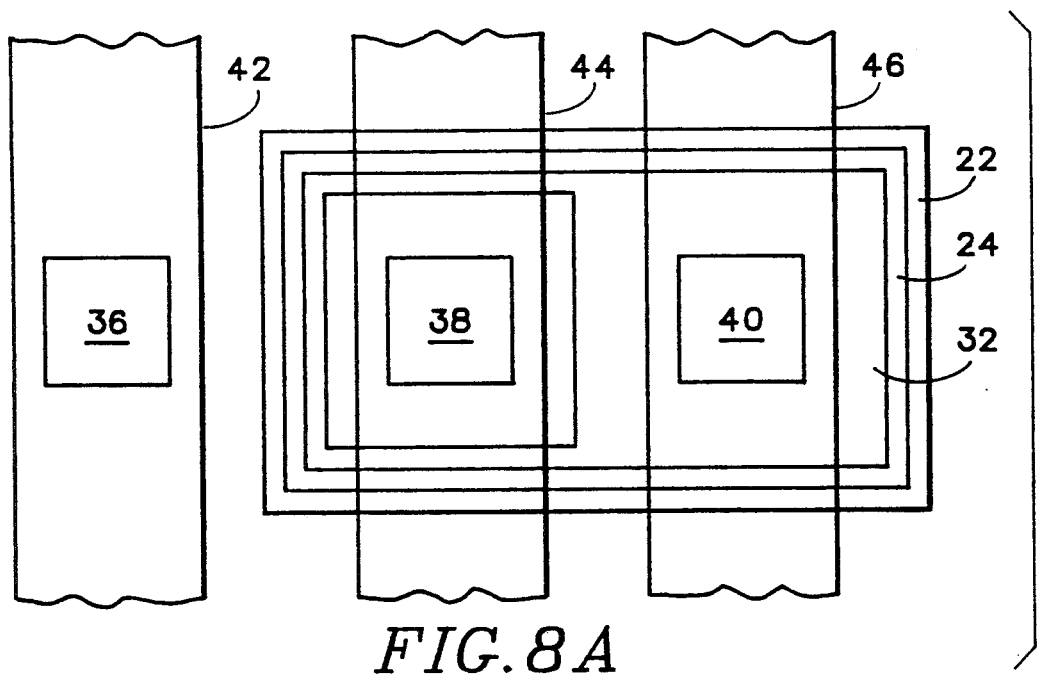

The corresponding plan view is shown in FIG. 8A in outline form only. The outline of the gate dielectric layer 22, the gate conductive layer 24, and the conductive layer 32 along the sidewalls of the trench and in the second portion of the mesa 14B is shown. The location of the drain contact 36, source contact 38, and gate contact 40, as well as the drain interconnect line 42, the source interconnect line 44, and the gate interconnect line is also shown.

Therefore, it has been shown that an insulated-gate vertical FET has a small horizontal area suitable for high density integration on a silicon die, since the gate and channel area are disposed along and within one or more sidewalls of the trench. The active gate region is continuous along the trench sidewall and is protected from further processing steps. The active gate region within each trench sidewall 16 is continuous from the mesa to the base and contains no sharp corners, edges, steps or other such discontinuous features that decrease breakdown voltage. Low parasitic gate-to-source overlap capacitance is reduced by the spacer dielectric layer 30 in order to maintain a high maximum operating frequency. Note in FIG. 8 that only the thin gate conductive layer 24 remains in close proximity to the second enhanced N-type layer 28, establishing a minimum overlap capacitance. Furthermore, the vertical FET has a high current drive capability at a given W/L ratio since the parasitic capacitance is low. It has also been shown that the vertical FET 10 requires no additional masking steps beyond those normally required for the fabrication of an integrated random access memory. For example, the N+ implant used to form the source and drain regions is typically creates the storage node of the capacitor for a memory cell.

It has also been shown that the source, drain, and gate contacts of the vertical FET 10 may all be contacted from the top surface of the die, if desired. It is appreciated, however, by those skilled in the art that the exact configuration and layout of the FET 10 can be changed in many ways. For example, the drain and gate contacts need not be placed in a row as shown in FIGS. 8 and 8A, but can be orthogonally arranged if required by layout considerations. Also, the source region of the FET 10 need not be contacted from the surface, but can be contacted through additional N-type layers in contact with N-type layer 28, or by directly metallizing the bottom surface of the die by any conventional means taught in the prior art. The source region of the FET 10 may also be coupled to a capacitor in a DRAM array configuration, while still maintaining the minimized gate-to-source overlap capacitance of the present invention.

The vertical FET 10 of the present invention is suitable for use in many applications, such as in a DRAM array, in an inverter, a buffer or driver circuit, or a stand-alone power FET. If minimum area is required, it is desirable that the gate of the vertical FET 10 be constructed in only one of the sidewalls of a rectangular trench. If maximum drive current is required for a power FET, it is desirable that the gate of the vertical FET 10 be constructed in all four sidewalls of a rectangular trench.

Having described and illustrated the principles of the invention in a preferred embodiment thereof, it is apparent that the invention can be modified in arrangement and detail without departing from those principles. For example, the polarity of the N-type and P-type layers discussed herein can be reversed, depending upon whether a P-channel or N-channel device is selected. As another example, the materials selected for the various layers and their attendant specifications can all be changed to suit the requirements of the application. Therefore, we claim all modifications and variations of the invention falling within the spirit and scope of the following claims.

We claim:

1. A vertical field-effect transistor having a drain, a source, and an insulated gate, comprising:
    a semiconductor substrate of a first conductivity type having a reference surface and including a trench, the trench defining a surface including a mesa at the level of the reference surface, a sidewall, and a base recessed from the reference surface;
    an insulated gate layer on the sidewall of the trench including a gate oxide layer and an adjacent gate polysilicon layer;
    a first layer of a second conductivity type in the mesa of the trench forming a first current node of the transistor;
    a second layer of the second conductivity type in the base of the trench forming a second current node of the transistor;
    a spacer dielectric layer having a thickness greater than the thickness of the gate oxide layer partially filling the trench; and
    a conductive layer located along the sidewall of the trench and in electrical contact with the gate polysilicon layer extending from the spacer dielectric layer to the reference surface,
    the conductive layer being spaced apart from the second layer of the second conductivity type by the spacer dielectric layer to decrease a parasitic capacitance between the conductive layer and the second layer of the second conductivity type.

2. A vertical field-effect transistor as in claim 1 in which the distance between the conductive layer and the second layer of the second conductivity type is selected to reduce the parasitic capacitance below a predetermined capacitance.

3. A vertical field-effect transistor as in claim 1 in which the base is recessed about 8000 to 10000 Angstroms from the reference surface.

4. A vertical field-effect transistor as in claim 1 in which the gate oxide layer is about 200 to 250 Angstroms thick.

5. A vertical field-effect transistor as in claim 1 in which the gate polysilicon layer is about 500 to 1000 Angstroms thick.

6. A vertical field-effect transistor as in claim 1 in which the gate polysilicon layer comprises a doped polysilicon layer having a resistivity of about fifty ohms per square.

7. A vertical field-effect transistor as in claim 1 in which the spacer dielectric oxide layer is about 2000 to 3000 Angstroms thick.

8. A vertical field-effect transistor as in claim 1 in which the conductive layer is about 5000 Angstroms thick.

9. A vertical field-effect transistor as in claim 1 in which the conductive layer comprises a doped polysilicon layer having a resistivity of about 25 to 35 ohms per square.

10. A vertical field-effect transistor having a drain, a source, and an insulated gate, comprising:
- a semiconductor substrate of a first conductivity type having a reference surface and including a trench, the trench defining a surface including a mesa at the level of the reference surface, a sidewall, and a base recessed from the reference surface;
- an insulated gate layer on the sidewall of the trench including a gate oxide layer and an adjacent gate polysilicon layer;
- a first layer of a second conductivity type in the mesa of the trench forming a first current node of the transistor;
- a second layer of the second conductivity type in the base of the trench forming a second current node of the transistor;
- a spacer oxide layer partially filling the trench;
- a second polysilicon layer located along the sidewall of the trench and in electrical contact with the gate polysilicon layer extending from the spacer oxide layer to the reference surface, the second polysilicon layer being electrically isolated from both the first and second layers of the second conductivity type; and
- a conductor extending from the mesa of the trench to the base of the trench to ohmically contact the second layer of the second conductivity type.

11. A vertical field-effect transistor as in claim 10 in which the base is recessed about 8000 to 10000 Angstroms from the reference surface.

12. A vertical field-effect transistor as in claim 10 in which the gate oxide layer is about 200 to 250 Angstroms thick.

13. A vertical field-effect transistor as in claim 10 in which the gate polysilicon layer is about 500 to 1000 Angstroms thick.

14. A vertical field-effect transistor as in claim 10 in which the gate polysilicon layer comprises a doped polysilicon layer having a resistivity of about fifty ohms per square.

15. A vertical field-effect transistor as in claim 10 in which the spacer oxide layer at the base of the trench is about 2000 to 3000 Angstroms thick.

16. A vertical field-effect transistor as in claim 10 in which the second polysilicon layer is about 2000 Angstroms thick.

17. A vertical field-effect transistor as in claim 10 in which the second polysilicon layer comprises a doped polysilicon layer having a resistivity of about 25 to 35 ohms per square.

* * * * *